(12) United States Patent
Iwanami (10) Patent No.: US 6,603,668 B2
(45) Date of Patent: Aug. 5, 2003

(54) INTERLAYER STRUCTURE WITH MULTIPLE INSULATIVE LAYERS WITH DIFFERENT FREQUENCY CHARACTERISTICS

(75) Inventor: Mizuki Iwanami, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 10/097,932

(22) Filed: Mar. 15, 2002

(65) Prior Publication Data

US 2002/0089798 A1 Jul. 11, 2002

Related U.S. Application Data

(62) Division of application No. 09/455,401, filed on Dec. 6, 1999, now Pat. No. 6,396,713.

(30) Foreign Application Priority Data

Dec. 4, 1998 (JP) .............................. 10-345776

(51) Int. Cl.[7] ................................................ H05K 1/14
(52) U.S. Cl. ........................ 361/794; 361/795; 174/256
(58) Field of Search ................................ 361/792–795, 361/780; 174/255–258, 36; 333/246

(56) References Cited

U.S. PATENT DOCUMENTS

| 4,291,708 A | * | 9/1981 | Frei et al. ................... 324/692 |
| 4,323,948 A | * | 4/1982 | Mercier et al. ............. 361/315 |
| 4,746,557 A | * | 5/1988 | Sakamoto et al. .......... 428/138 |
| 5,010,641 A | * | 4/1991 | Sisler .......................... 29/830 |
| 5,491,301 A | | 2/1996 | Akiba et al. ................. 174/250 |
| 5,929,729 A | * | 7/1999 | Swarup ....................... 333/246 |
| 5,966,294 A | | 10/1999 | Harada et al. .............. 361/794 |
| 6,002,593 A | | 12/1999 | Tohya et al. ................ 361/765 |
| 6,075,211 A | | 6/2000 | Tohya et al. ................ 174/255 |
| 6,111,479 A | | 8/2000 | Myohga et al. ............. 333/184 |
| 6,198,362 B1 | * | 3/2001 | Harada et al. ................ 333/12 |
| 6,353,540 B1 | * | 3/2002 | Akiba et al. ................. 361/794 |

* cited by examiner

Primary Examiner—Lynn D. Feild
Assistant Examiner—Hae Moon Hyeon
(74) Attorney, Agent, or Firm—Young & Thompson

(57) ABSTRACT

An inter-layer structure between a power layer and a ground layer of a printed circuit board includes an insulative magnetic structure with at least two layers of insulative magnetic substances with different complex magnetic permeability frequency characteristics.

8 Claims, 7 Drawing Sheets

15a : volume ratio of sendust powders to epoxy resin is about 64 : 36, averaged particle diameter of sendust powders is about 36 $\mu$ m.

15b : volume ratio of sendust powders to epoxy resin is about 64 : 36, averaged particle diameter of sendust powders is about 8 $\mu$ m.

FIG. 5B

15a : volume ratio of sendust powders to epoxy resin is about 64 : 36, averaged particle diameter of sendust powders is about 36 μm.

15b : volume ratio of Sendust powders to epoxy resin is about 64 : 36, averaged particle diameter of Sendust powders is about 8 μm.

FIG. 6

INTERLAYER STRUCTURE WITH MULTIPLE INSULATIVE LAYERS WITH DIFFERENT FREQUENCY CHARACTERISTICS

BACKGROUND OF THE INVENTION

The present invention relates to a multilayer printed circuit board capable of preventing electromagnetic interference.

A high frequency current is applied to integrated circuits or large scale integrated circuits of the multilayer printed circuit board. The multilayer printed circuit board has a power layer, a ground layer and a signal layer. If the power layer and the ground layer form a large current loop circuit, then a problem with the electromagnetic interference may be raised. In Japanese patent No. 2734447, it is disclosed that in order to avoid this problem with the electromagnetic interference, a power de-coupling is emphasized, wherein the power layer comprises a wiring layer which includes an impedance-adding circuit. The impedance-adding circuit may be shaped in zigzag, crossing or spiral to avoid formation of the current loop. This power layer is sandwiched between underlying and overlying insulation layers which are made of an insulator mixed with a magnetic substance.

The above structure of the multilayer printed circuit board has the following problems.

The first problem is that when the integrated circuits or the large scale integrated circuits mounted on the multilayer printed circuit board are in operation, a high frequency current is applied to the power layer whereby the high frequency current applied to the power layer forms a large current loop which serves as a loop antenna which generates a radiation electromagnetic noise.

The second problem is that a current supplied from the power layer for switching the integrated circuits or the large scale integrated circuits causes variation in voltage of the power system comprising the power layer and the ground layer, whereby a stationary wave is caused and the power system serves as an antenna, so that the radiation electromagnetic noise with a frequency of the stationary wave is generated.

In Japanese laid-open patent publication No 10-303563, a multilayer printed circuit board is disclosed. A single insulating layer is provided between the power layer and the ground layer. The single insulating layer include magnetic films which partially extend on selected regions of the insulating layer. The magnetic films are different in magnetic permeability, so that the insulating layer with the partially formed magnetic films serves as an electromagnetic shielding layer. Since the magnetic films are aligned in a single plane, it is possible for this conventional structure to attenuate the electromagnetic wave but only at a corresponding frequency to the frequency characteristic of the magnetic film. Accordingly, it is difficult for this conventional structure to attenuate the electromagnetic wave in a wide frequency range.

In Japanese laid-open patent publication No. 10-163636, it is also disclosed that magnetic sheet lamination structures are provided on both surfaces of a lamination of the power layer and the wiring layer. Each of the magnetic sheet lamination structures comprises a high magnetic permeability magnetic sheet and two low magnetic permeability magnetic sheets which sandwich the high magnetic permeability magnetic sheet. This magnetic sheet lamination structure is provided in order to increase the high frequency impedance with keeping the insulation between the power layer and the ground layer. The magnetic sheet lamination structure is not provided between the power layer and the ground layer which form a power system as a current loop. The magnetic sheet lamination structure is not provided in the current loop, for which reason the above structure having the magnetic sheet lamination structure is inapplicable to suppress the radiation electromagnetic noise.

Further, in Japanese laid-open patent publication No. 9-275251, various patterns of the conductive film applied to the multilayer printed circuit board are disclosed.

In Japanese laid-open patent publication No. 7-321463, a meshed interconnection layer applied for the multilayer printed circuit board are disclosed.

In Japanese laid-open patent publication No. 6-318650, plural stripe shaped power layers and ground layers applied for the multilayer printed circuit board are disclosed.

The foregoing conventional structures of the multilayer printed circuit boards are incapable of suppressing generation of a radiation electromagnetic noise and also incapable of attenuating the electromagnetic wave in the wide frequency range.

In the above circumstances, it had been required to develop a novel free from the above problem.

SUMMARY OF THE INVENTION

Accordingly, it is an object of the present invention to provide a novel multilayer printed circuit board free from the above problems.

It is a farther object of the present invention to provide a novel multilayer printed circuit board capable of suppressing generation, in the wide frequency range, of a radiation electromagnetic noise from a power system comprising a power layer and a ground layer.

It is a still further object of the present invention to provide a novel multilayer printed circuit board capable of attenuating the electromagnetic wave in the wide frequency range.

It is yet a further object of the present invention to provide a novel multilayer printed circuit board capable of allowing a majority part of the high frequency current applied to the power layer to by-pass to a closest de-coupling capacitor so as to reduce, as many as possible, an effective high frequency current loop formed in the power system of the multilayer printed circuit board.

The present invention provides an inter-layer structure between a power layer and a ground layer. The inter-layer structure comprises an insulative magnetic layered structure which comprises at least two insulative magnetic substances which are different in frequency characteristic of complex magnetic permeability.

The other present invention provides an inter-layer structure between a power layer and a ground layer. The inter-layer structure comprises a dielectric layered structure which comprises at least two dielectric substances which are different in frequency characteristic of complex dielectric constant.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

The first present invention provides an inter-layer structure between a power layer and a ground layer. The inter-layer structure comprises an insulative magnetic layered structure which comprises at least two insulative magnetic substances which are different in frequency characteristic of complex magnetic permeability.

It is important that the insulative magnetic layered structure comprises at least two insulative magnetic substances which are different in frequency characteristic of complex magnetic permeability $\mu^*$, wherein $\mu^*=\mu'-j\mu''$. The imaginary part $\mu''$ of the complex magnetic permeability $\mu^*$ is utilized to attenuate the electromagnetic wave in a wide frequency range. A frequency characteristic of a high impedance device depends upon a frequency characteristic of a real part $\mu'$ of the complex magnetic permeability $\mu^*$, wherein $\mu^*=\mu'-j\mu''$. Further, if a stationary wave is present in the power system of the device, this stationary wave is attenuated by the imaginary part $\mu''$ of the complex magnetic permeability $\mu^*$, whereby the electromagnetic noise radiated from the power system may be suppressed. The attenuation characteristic of the electromagnetic wave generated from the power system has such a spectrum shape as averaging imaginary parts $\mu''$ of individuals of the at least two insulative magnetic substances. The at least two insulative magnetic substances which are different in frequency characteristic of complex magnetic permeability $\mu^*$ suppress the radiation electromagnetic noises from the power system in the wide frequency-range.

It is preferable that each of the at least two insulative magnetic substances comprises magnetic powders and a resin, and the at least two insulative magnetic substances are different in material of the magnetic powders.

It is also preferable that each of the at least two insulative magnetic substances comprises magnetic powders and a resin, and the at least two insulative magnetic substances are different in volume ratio of the magnetic powders.

It is also preferable that each of the at least two insulative magnetic substances comprises magnetic powders and a resin, and the at least two insulative magnetic substances are different in averaged particle diameter of the magnetic powders.

It is also preferable that each of the at least two insulative magnetic substances comprises a single kind of ferrite, and the at least two insulative magnetic substances are different in the kind of ferrite.

It is also preferable that each of the at least two insulative magnetic substances comprises plural kinds of ferrite, and the at least two insulative magnetic substances are the same in the plural kinds of ferrite and different in composition of ferrite.

It is also preferable that the insulative magnetic layered structure comprises laminations of at least two layers being respectively made of insulative magnetic substances which are different in frequency characteristic of complex magnetic permeability.

The second present invention provides a multilayer printed circuit board having at least a signal layer, at least a power layer, at least a ground layer, and an inter-layer structure between the power layer and the ground layer, wherein the inter-layer structure comprises an insulative magnetic layered structure which comprises at least two insulative magnetic substances which are different in frequency characteristic of complex magnetic permeability.

It is important that the insulative magnetic layered structure comprises at least two insulative magnetic substances which are different in frequency characteristic of complex magnetic permeability $\mu^*$, wherein $\mu^*=\mu'-j\mu''$. The imaginary part $\mu''$ of the complex magnetic permeability $\mu^*$ is utilized to attenuate the electromagnetic wave in a wide frequency range. A frequency characteristic of a high impedance device depends upon a frequency characteristic of a real part $\mu'$ of the complex magnetic permeability $\mu^*$, wherein $\mu^*=\mu'-j\mu''$. Further, if a stationary wave is present in the power system of the device, this stationary wave is attenuated by the imaginary part $\mu''$ of the complex magnetic permeability $\mu^*$, whereby the electromagnetic noise radiated from the power system may be suppressed. The attenuation characteristic of the electromagnetic wave generated from the power system has such a spectrum shape as averaging imaginary parts $\mu''$ of individuals of the at least two insulative magnetic substances. The at least two insulative magnetic substances which are different in frequency characteristic of complex magnetic permeability $\mu^*$ suppress the radiation electromagnetic noises from the power system in the wide frequency range.

It is preferable that each of the at least two insulative magnetic substances comprises magnetic powders and a resin, and the at least two insulative magnetic substances are different in material of the magnetic powders.

It is also preferable that each of the at least two insulative magnetic substances comprises magnetic powders and a resin, and the at least two insulative magnetic substances are different in volume ratio of the magnetic powders.

It is also preferable that each of the at least two insulative magnetic substances comprises magnetic powders and a resin, and the at least two insulative magnetic substances are different in averaged particle diameter of the magnetic powders.

It is also preferable that each of the at least two insulative magnetic substances comprises a single kind of ferrite, and the at least two insulative magnetic substances are different in the kind of ferrite.

It is also preferable that each of the at least two insulative magnetic substances comprises plural kinds of ferrite, and the at least two insulative magnetic substances are the same in the plural kinds of ferrite and different in composition of ferrite.

It is also preferable that the insulative magnetic layered structure comprises laminations of at least two layers being respectively made of insulative magnetic substances which are different in frequency characteristic of complex magnetic permeability.

It is also preferable that the at least power layer comprises a wiring layer which has at least an inductor part serving as an inductor and the at least power layer is connected to a de-coupling capacitor.

It is further preferable that the at least an inductor part comprises a plurality of divided lines and first and second branched parts which are connected to each other through the divided lines.

The third present invention provides an inter-layer structure between a power layer and a ground layer. The inter-layer structure comprises a dielectric layered structure which comprises at least two dielectric substances which are different in frequency characteristic of complex dielectric constant.

It is important that the dielectric layered structure comprises at least two dielectric substances which are different in frequency characteristic of complex dielectric constant $\epsilon^*$, wherein $\epsilon^* = \epsilon' - j\epsilon''$. The dielectric losses of the at least two dielectric substances are utilized to attenuate the electromagnetic wave in a wide frequency range. The attenuation characteristic of the electromagnetic wave generated from the power system depends upon a frequency characteristic of the dielectric losses of the at least two dielectric substances. The imaginary part $\epsilon''$ of the complex dielectric constant $\epsilon^*$ is utilized to attenuate the electromagnetic wave in a wide frequency range. A frequency characteristic of a high impedance device depends upon a frequency characteristic of a real part $\epsilon'$ of the complex dielectric constant $\epsilon^*$, wherein $\epsilon^* = \epsilon' - j\epsilon''$. Further, if a stationary wave is present in the power system of the device, this stationary wave is attenuated by the imaginary part $\epsilon''$ of the complex dielectric constant $\epsilon^*$, whereby the electromagnetic noise radiated from the power system may be suppressed. The attenuation characteristic of the electromagnetic wave generated from the power system has such a spectrum shape as averaging imaginary parts $\epsilon''$ of individuals of the at least two dielectric substances. The at least two dielectric substances which are different in frequency characteristic of complex dielectric constant $\epsilon^*$ suppress the radiation electromagnetic noises from the power system in the wide frequency range.

It is preferable that the at least two dielectric substances are large in dielectric loss.

It is also preferable that the dielectric layered structure comprises laminations of at least two layers being respectively made of dielectric substances which are different in frequency characteristic of complex dielectric constant.

It is also preferable that the at least power layer comprises a wiring layer which has at least an inductor part serving as an inductor and the at least power layer is connected to a de-coupling capacitor.

It is also preferable that the at least an inductor part comprises a plurality of divided lines and first and second branched parts which are connected to each other through the divided lines.

It is important that the dielectric layered structure comprises at least two dielectric substances which are different in frequency characteristic of complex dielectric constant $\epsilon^*$, wherein $\epsilon^* = \epsilon' - j\epsilon''$. The dielectric losses of the at least two dielectric substances are utilized to attenuate the electromagnetic wave in a wide frequency range. The attenuation characteristic of the electromagnetic wave generated from the power system depends upon a frequency characteristic of the dielectric losses of the at least two dielectric substances. The imaginary part $\epsilon''$ of the complex dielectric constant $\epsilon^*$ is utilized to attenuate the electromagnetic wave in a wide frequency range. A frequency characteristic of a high impedance device depends upon a frequency characteristic of a real part $\epsilon'$ of the complex dielectric constant $\epsilon^*$, wherein $\epsilon^* = \epsilon' - j\epsilon''$. Further, if a stationary wave is present in the power system of the device, this stationary wave is attenuated by the imaginary part $\epsilon''$ of the complex dielectric constant $\epsilon^*$, whereby the electromagnetic noise radiated from the power system may be suppressed. The attenuation characteristic of the electromagnetic wave generated from the power system has such a spectrum shape as averaging imaginary parts $\epsilon''$ of individuals of the at least two dielectric substances. The at least two dielectric substances which are different in frequency characteristic of complex dielectric constant $\epsilon^*$ suppress the radiation electromagnetic noises from the power system in the wide frequency range.

It is also preferable that the at least two dielectric substances are large in dielectric loss.

It is also preferable that the dielectric layered structure comprises laminations of at least two layers being respectively made of dielectric substances which are different in frequency characteristic of complex dielectric constant.

The fourth present invention provides a multilayer printed circuit board having at least a signal layer, at least a power layer, at least a ground layer, and an inter-layer structure between the power layer and the ground layer, wherein the inter-layer structure comprises a dielectric layered structure which comprises at least two dielectric substances which are different in frequency characteristic of complex dielectric constant.

DESCRIPTION OF THE PREFERRED EMBODIMENT

Figure 1:
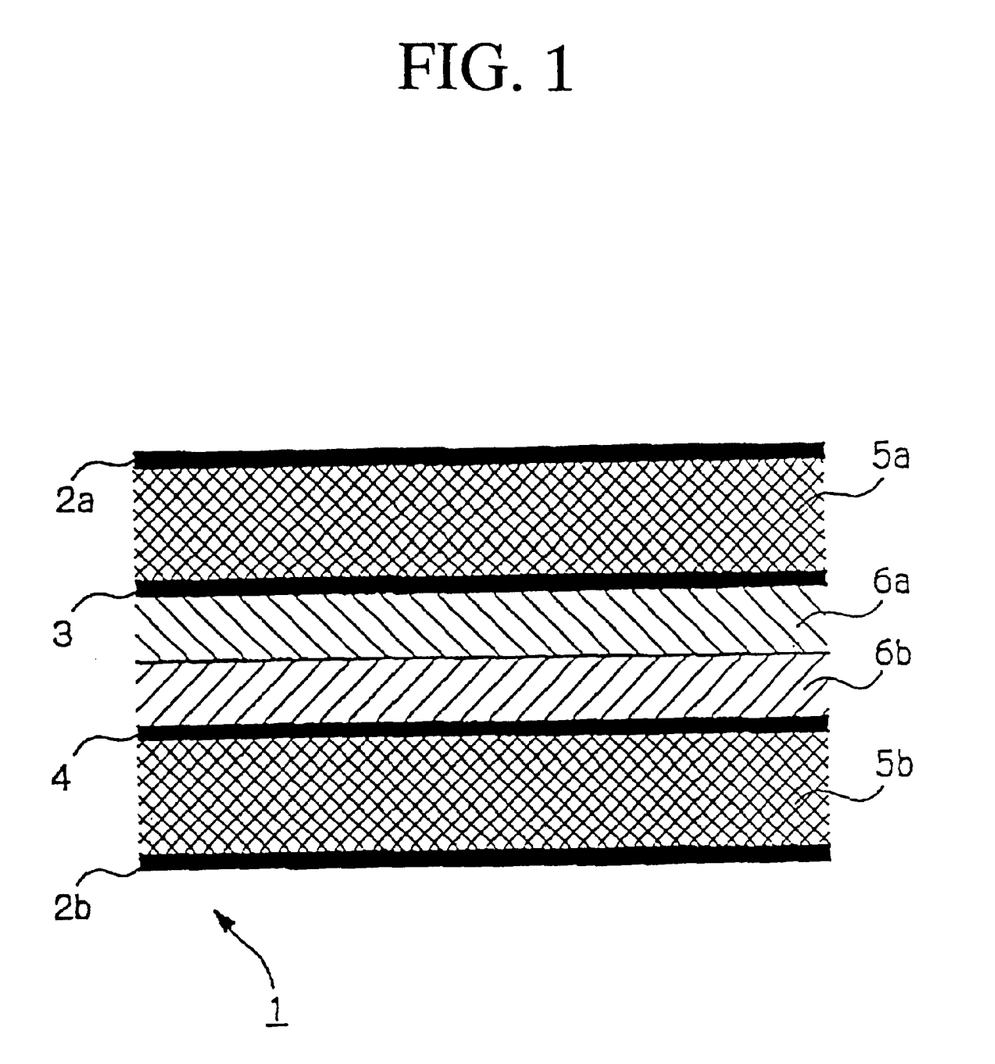
FIG. 1 is a fragmentary cross sectional elevation view illustrative of a novel multilayer printed circuit board having an improved inter-layer structure provided between a power layer and a ground layer in a first embodiment in accordance with the first and second present inventions.
Figure 2:
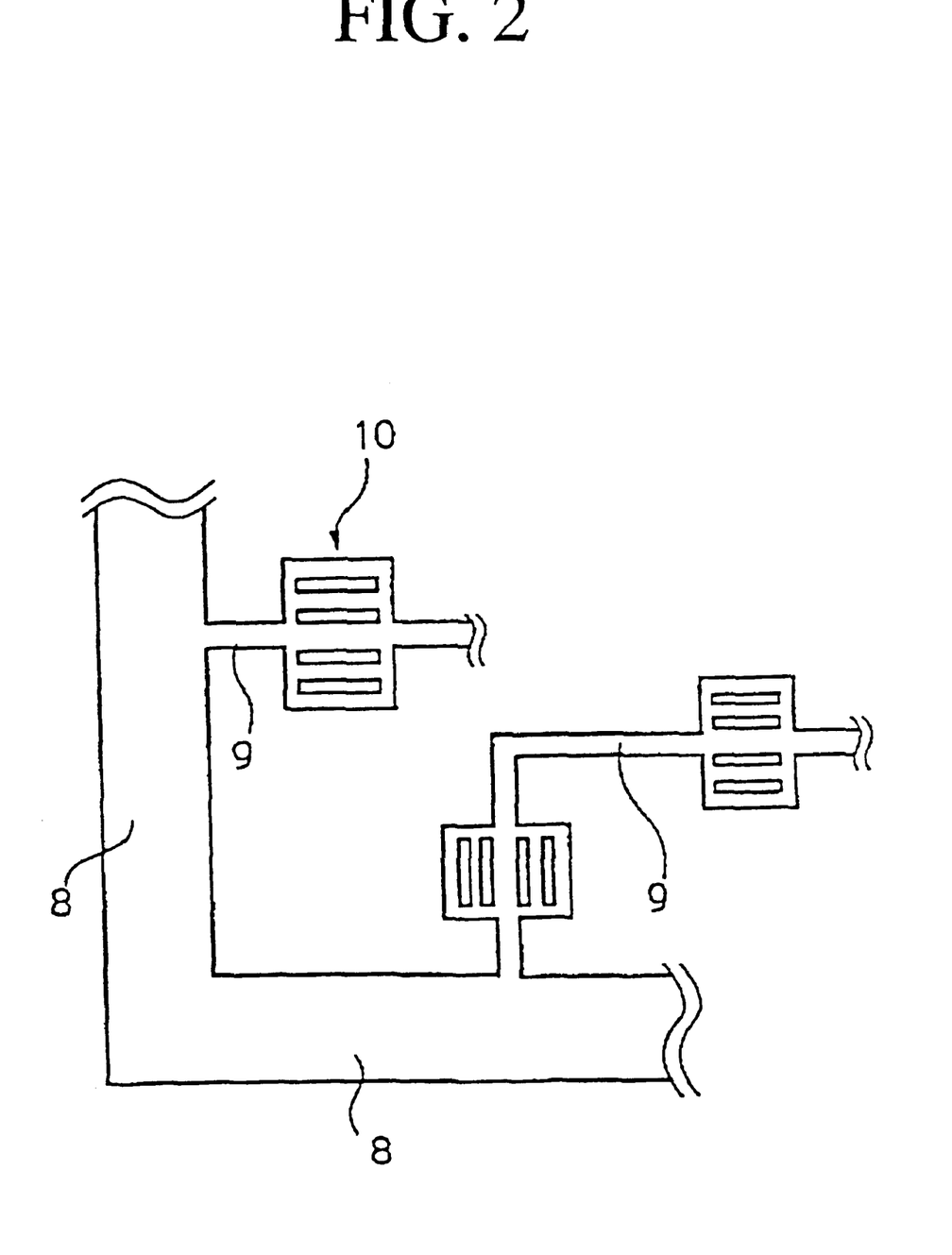
FIG. 2 is a fragmentary plan view illustrative of a power layer of a novel multilayer printed circuit board of FIG. 1.
Figure 3:
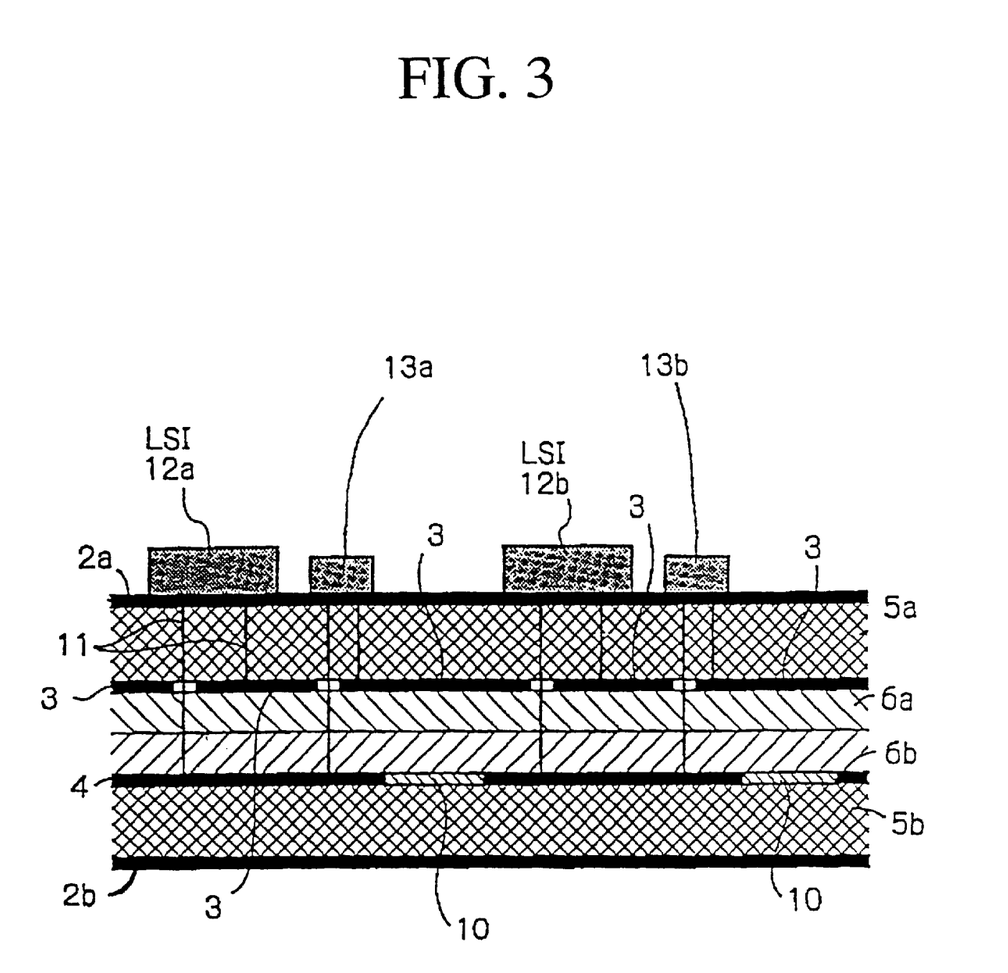
FIG. 3 is a fragmentary cross sectional elevation view illustrative of the novel multilayer painted circuit board in use of FIG. 1.
Figure 4:
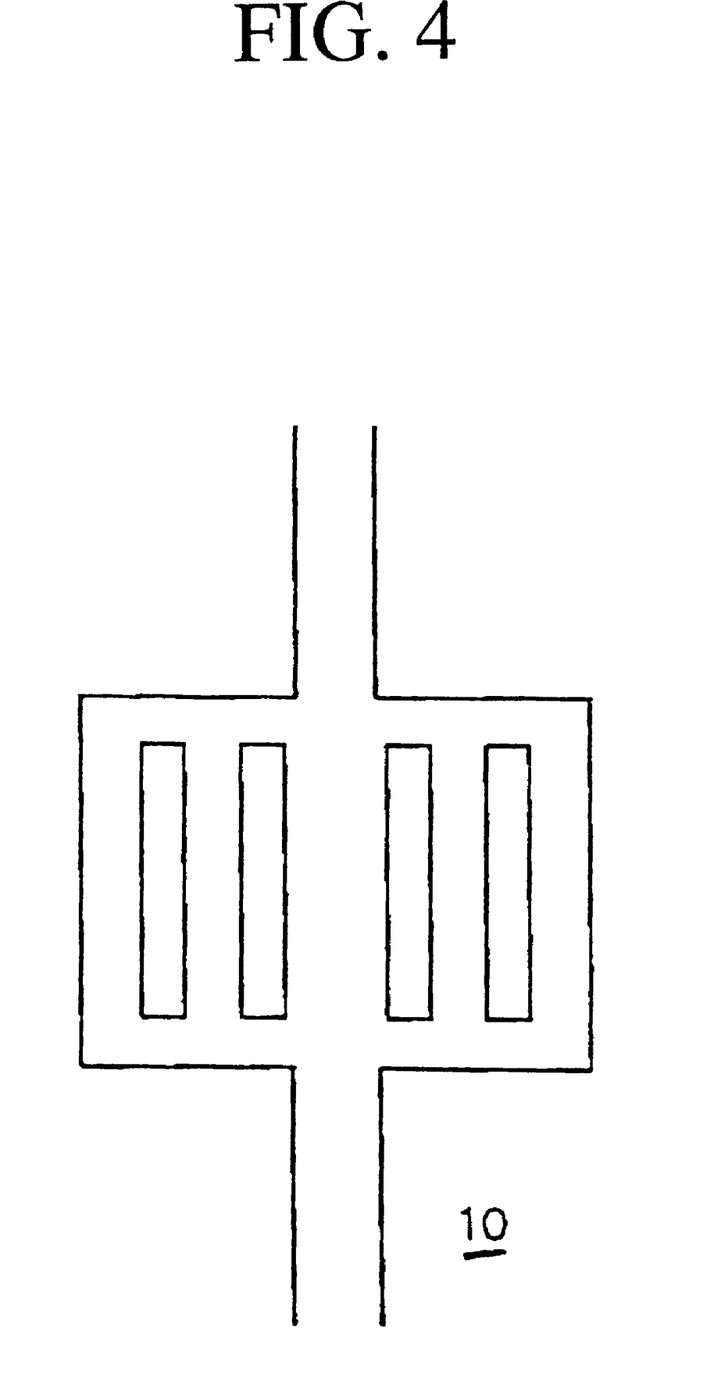
FIG. 4 is a fragmentary cross sectional elevation view illustrative of an inductor device of a power layer of FIG. 2.
Figure 5A:
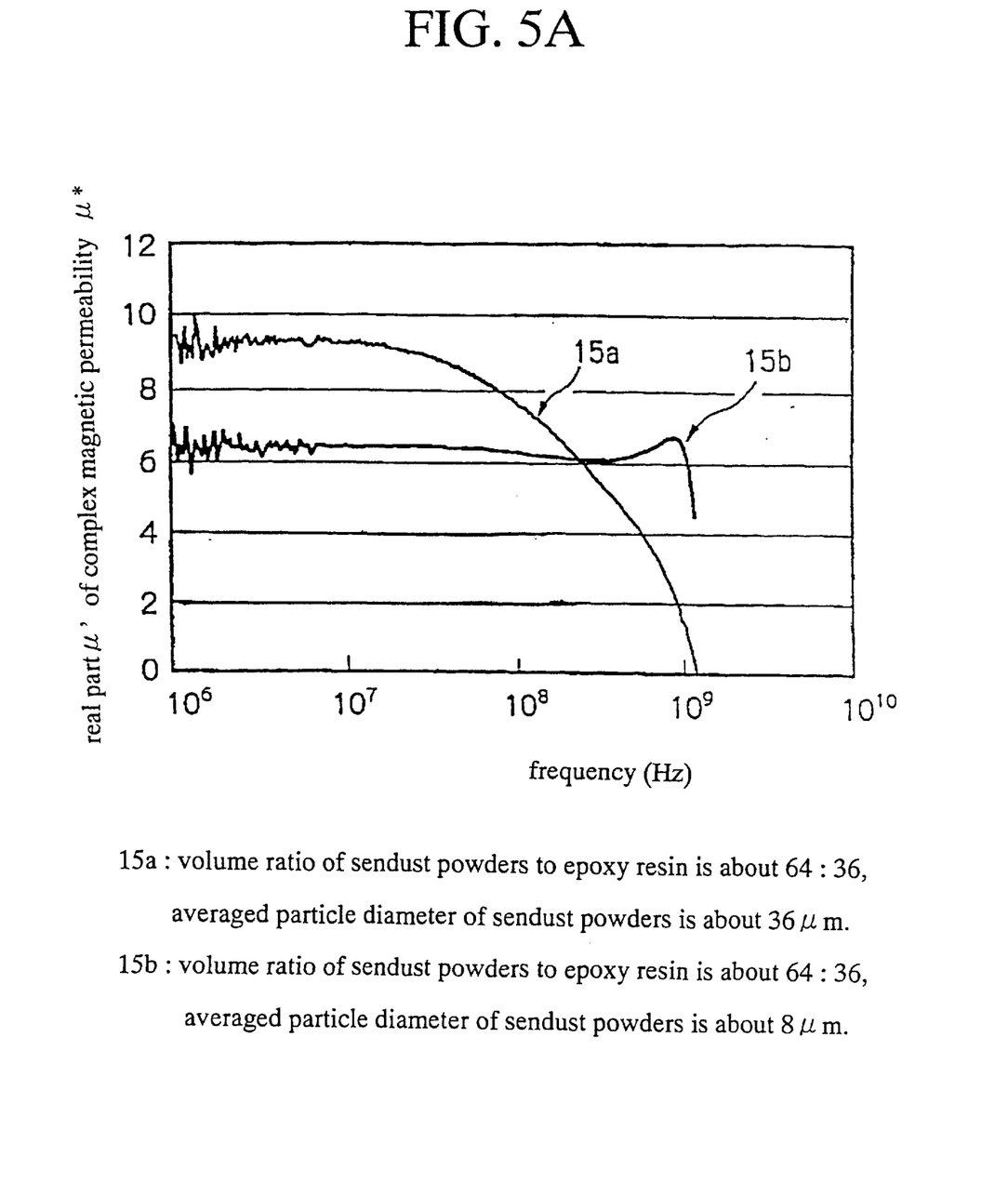
FIG. 5A is a diagram illustrative of a frequency characteristic of a real part $\mu'$ of a complex magnetic permeability $\mu^*$, wherein $\mu^*=\mu'-j\mu''$, of each of first and second insulative magnetic substances of first and second insulative magnetic layers laminated to form an inter-layer structure of a novel multilayer printed circuit board.
Figure 5B:
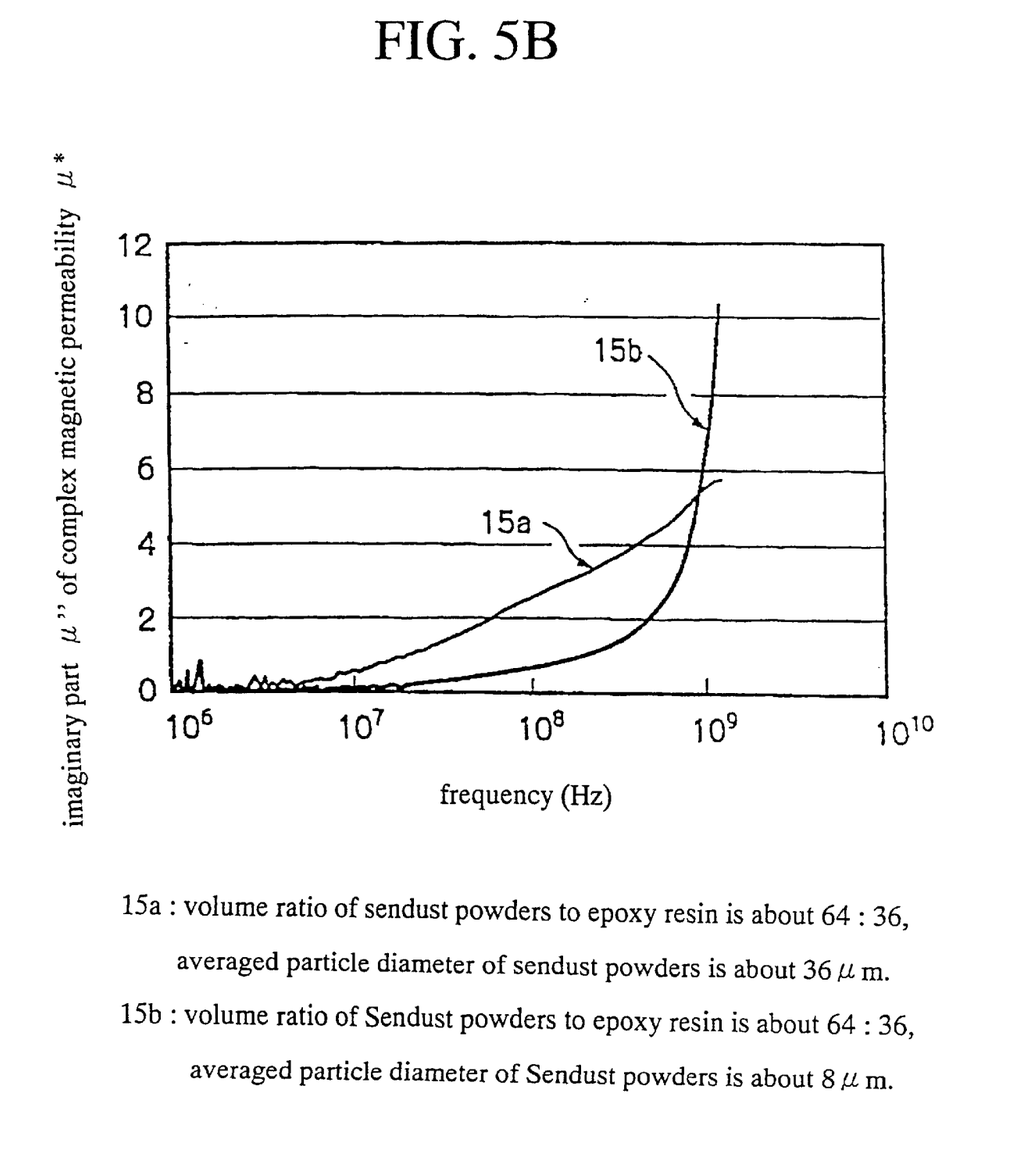
FIG. 5B is a diagram illustrative of a frequency characteristic of an imaginary part $\mu''$ of a complex magnetic permeability $\mu^*$, wherein $\mu^*=\mu'-j\mu''$, of each of first and second insulative magnetic substances of first and second insulative magnetic layers laminated to form an inter-layer structure of a novel multilayer printed circuit board.

First Embodiment:

A first embodiment according to the present invention will be described in detail with reference to the drawings. FIG. 1 is a fragmentary cross sectional elevation view illustrative of a novel multilayer printed circuit board having an improved inter-layer structure provided between a power layer and a ground layer in a first embodiment in accordance with the first and second present inventions. FIG. 2 is a fragmentary plane view illustrative of a power layer of a novel multilayer printed circuit board of FIG. 1. FIG. 3 is a fragmentary cross sectional elevation view illustrative of the novel multilayer printed circuit board in use of FIG. 1. FIG. 4 is a fragmentary cross sectional elevation view illustrative of an inductor device of a power layer of FIG. 2. FIG. 5A is a diagram illustrative of a frequency characteristic of a real part $\mu'$ of a complex magnetic permeability $\mu^*$, wherein $\mu^* = \mu' - j\mu''$, of each of first and second insulative magnetic substances of first and second insulative magnetic layers laminated to form an inter-layer structure of a novel multilayer printed circuit board. FIG. 5B is a diagram illustrative of a frequency characteristic of an imaginary part $\mu''$ of a complex magnetic permeability $\mu^*$, wherein $\mu^* = \mu' - j\mu''$, of each of first and second insulative magnetic substances of first and second insulative magnetic layers laminated to form an inter-layer structure of a novel multilayer printed circuit board.

With reference to FIG. 1, a first embodiment of the novel multilayer printed circuit board has the following lamination structure. The novel multilayer printed circuit board 1 has first and second insulative magnetic layers 6a and 6b laminated to form an inter-layer structure which is sandwiched between a power layer 4 and a ground layer 3. The ground layer 3 is also isolated by a first insulating layer 5a from a first signal layer 2a. The power layer 4 is also isolated by a second insulating layer 5b from a second signal layer 2b.

Namely, the inter-layer structure between the power layer 4 and the ground layer 3 comprises the first and second insulative magnetic layers 6a and 6b which respectively comprise first and second insulative magnetic substances which are different in frequency characteristic of complex magnetic permeability $\mu^*$, wherein $\mu^*=\mu'-j\mu''$.

It is preferable that each of the first and second insulative magnetic substances comprises magnetic powders and a resin, and the first and second insulative magnetic substances are different in material of the magnetic powders.

It is also preferable that each of the first and second insulative magnetic substances comprises magnetic powders and a resin, and the first and second insulative magnetic substances are different in volume ratio of the magnetic powders.

It is also preferable that each of the first and second insulative magnetic substances comprises magnetic powders and a resin, and the first and second insulative magnetic substances are different in averaged particle diameter of the magnetic powders.

It is also preferable that each of the first and second insulative magnetic substances comprises a single kind of ferrite, and the first and second insulative magnetic substances are different in the kind of ferrite.

It is also preferable that each of the first and second insulative magnetic substances comprises plural kinds of ferrite, and the first and second insulative magnetic substances are the same in the plural kinds of ferrite and different in composition of ferrite.

As shown in FIG. 2, it is also preferable that the power layer comprises a wiring layer which comprises a main wiring line part 8 and a plurality of branched wiring line parts 9 which have inductor parts 10 serving as inductors, wherein the inductor parts 10 are positioned near an IC or LSI.

As shown in FIG. 3, each of the inductor parts 10 may comprise a plurality of divided lines and first and second branched parts which are connected to each other through said divided lines.

As shown in FIG. 3, the first and second insulative magnetic layers 6a and 6b are laminated to form an inter-layer structure which is sandwiched between a power layer 4 and a ground layer 3. The ground layer 3 is also isolated by a first insulating layer 5a from a first signal layer 2a. The power layer 4 is also isolated by a second insulating layer 5b from a second signal layer 2b. The power layer 4 has inductor devices 10. The power layer 4 is connected through conductors 11 to LSIs 12a and 12b which are provided on the first signal layer 2a. The ground layer 3 is connected through conductors 11 to LSIs 12a and 12b. The power layer 4 is connected through conductors 11 to de-coupling capacitors 13 and 13b which are provided on the first signal layer 2a. The ground layer 3 is also connected through conductors 11 to the de-coupling capacitors 13a and 13b. When the LSI 12a is in operation, a high frequency current flows from the LSI 12a through the conductor 11 to the power layer 4. This high frequency current further flows through the conductors 11 to not only the de-coupling capacitor 13a which is positioned near the LSI 12a but also other de-coupling capacitor 13b which is positioned far from the LSI 12a. The high frequency currents further flow from the de-coupling capacitors 13a and 13b through the conductors 11 to the ground layer 3. The current path through the de-coupling capacitor 13b far from the LSI 12a forms a large current loop. Further, in switching the LSIs 12a and 12b, a switching current is supplied from the power layer 4 to each of the LSIs 12a and 12b. This switching current supply causes variation in voltage of a power system which comprises the power layer 4 and the ground layer 3, whereby a stationary wave is present in the power system. The first and second insulative magnetic layers 6a and 6b are, however, provided which respectively comprise first and second first and second insulative magnetic substances which are different in frequency characteristic of complex magnetic permeability $\mu^*$, wherein $\mu^*=\mu'-j\mu''$. The imaginary part $\mu''$ of the complex magnetic permeability $\mu^*$ is utilized to attenuate the electromagnetic wave in a wide frequency range. A frequency characteristic of a high impedance device depends upon a frequency characteristic of a real part $\mu'$ of the complex magnetic permeability $\mu^*$, wherein $\mu^*=\mu'-j\mu''$. Further, the stationary wave is attenuated by the imaginary part $\mu''$ of the complex magnetic permeability $\mu^*$, whereby the electromagnetic noise radiated from the power system is suppressed. The attenuation characteristic of the +electromagnetic wave generated from the power system has such a spectrum shape as averaging imaginary parts $\mu''$ of individuals of the first and second insulative magnetic substances. The first and second insulative magnetic substances which are different in frequency characteristic of complex magnetic permeability $\mu^*$ suppress the radiation electromagnetic noises from the power system in the wide frequency range.

The above first and second insulative magnetic layers 6a and 6b provide high impedance to the high frequency current flowing through the power layer 4, for which reason a majority part of the high frequency current from the LSI 12a flows through the do-coupling capacitor 13a positioned near the LSI 12a, whilst a majority part of the other high frequency current from the LSI 12b flows through the de-coupling capacitor 13b positioned near the LSI 12b. No large loop is thus formed, whereby the radiation electromagnetic noise is suppressed. The frequency characteristic of the high impedance device depends upon the frequency characteristic of the real part $\mu'$ of the complex magnetic permeability $\mu^*$, wherein $\mu^*=\mu'-j\mu''$. If a stationary wave is present in the power system of the device in switching the LSIs, this stationary wave is attenuated by the imaginary part $\mu''$ of the complex magnetic permeability $\mu^*$ of each of the first and second insulative magnetic substances of the first and second insulative magnetic layers 6a and 6b, whereby the electromagnetic noise radiated from the power system may be suppressed. The attenuation characteristic of the electromagnetic wave generated from the power system has such a spectrum shape as averaging imaginary parts $\mu''$ of individuals of the first and second insulative magnetic substances.

The following description will be focus on one available example of the first and second insulative magnetic layers 6a and 6b which comprise the same magnetic powders mixed in the same resin to have the same volume ratio of the magnetic powders but the first and second insulative magnetic layers 6a and 6b are different in averaged particle diameter of the magnetic powders. The first insulative magnetic layer 6a comprises sendust powders and an epoxy resin, wherein a volume ratio of sendust powders to epoxy resin is about 64:36, and the averaged particle diameter of sendust powders is about 36 micrometers. The second insulative magnetic layer 6a comprises sendust powders and an epoxy resin, wherein a volume ratio of sendust powders to epoxy resin is about 64:36, and the averaged particle diameter of sendust powders is about 8 micrometers;

FIG. 5A is a diagram illustrative of a frequency characteristic of a real part $\mu'$ of a complex magnetic permeability $\mu^*$, wherein $\mu^*=\mu'-j\mu''$, of each of first and second insulative magnetic substances 15a and 15b of the first and second insulative magnetic layers 6a and 6b, wherein the first insulative magnetic layer 6a comprises sendust powders and an epoxy resin, where a volume ratio of sendust powders to epoxy resin is about 64:36, and the averaged particle diameter of sendust powders is about 36 micrometers, whilst the second insulative magnetic layer 6a comprises sendust powders and an epoxy resin, wherein a volume ratio of sendust powders to epoxy resin is about 64:36, and the averaged particle diameter of sendust powders is about 8 micrometers. FIG. 5B is a diagram illustrative of a frequency characteristic of an imaginary part $\mu''$ of a complex magnetic permeability $\mu^*$, wherein $\mu^*=\mu'-j\mu''$, of each of first and second insulative magnetic substances 15a and 15b of the first and second insulative magnetic layers 6a and 6b, wherein the first insulative magnetic layer 6a comprises sendust powders and an epoxy resin, where a volume ratio of sendust powders to epoxy resin is about 64:36, and the averaged particle diameter of sendust powders is about 36 micrometers, whilst the second insulative magnetic layer 6a comprises sendust powders and an epoxy resin, wherein a volume ratio of sendust powders to epoxy resin is about 64:36, and the averaged particle diameter of sendust powders is about 8 micrometers. The attenuation characteristic of the electromagnetic wave generated from the power system has such a spectrum shape as averaging imaginary parts $\mu''$ of individuals of the first and second insulative magnetic substances. The first and second insulative magnetic substances 15a and 15b different in frequency characteristic of complex magnetic permeability $\mu^*$ can suppress the radiation electromagnetic noises from the power system in the wide frequency range A second embodiment according to the present invention will be described in detail with reference to the drawings.

Figure 6:
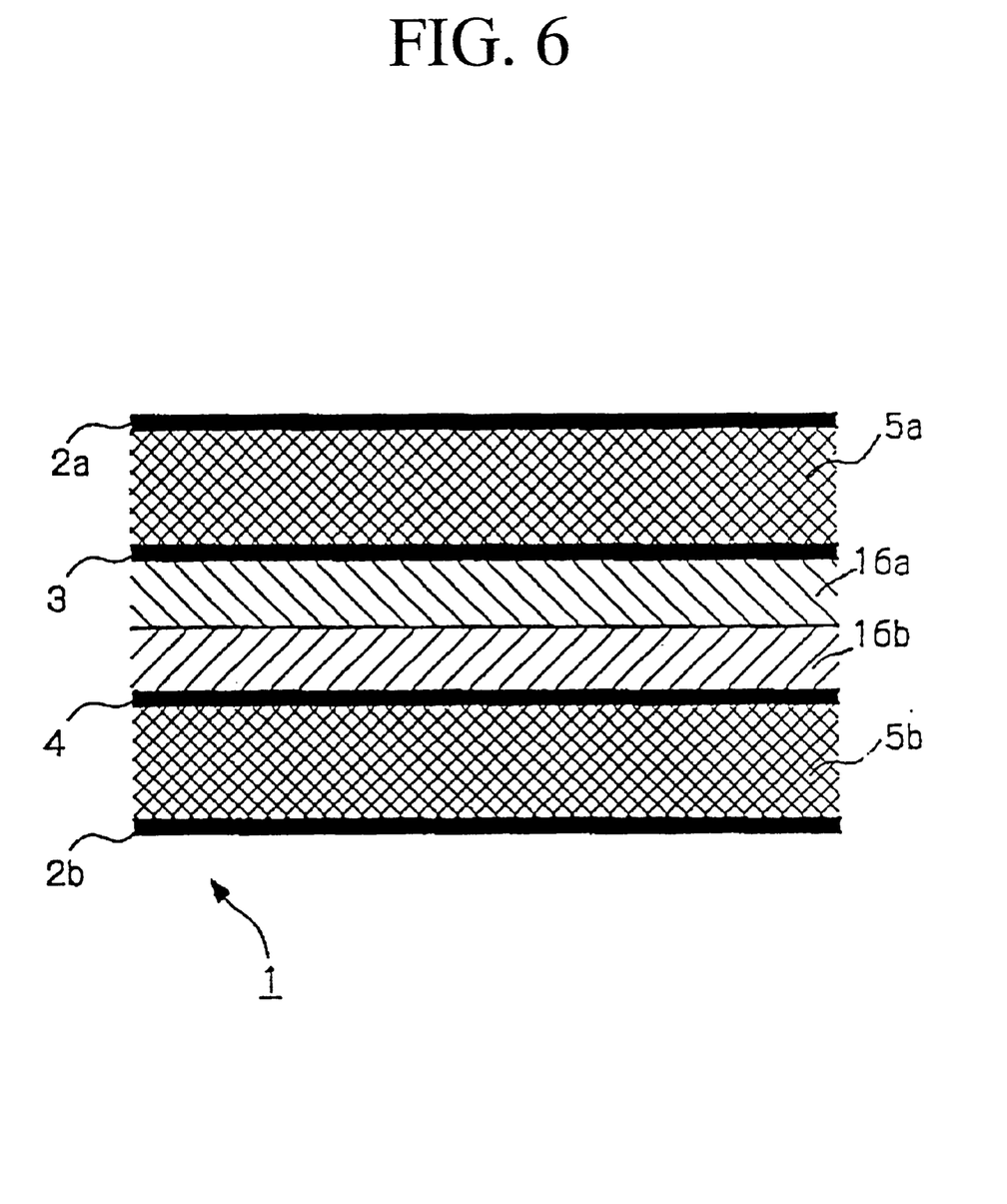
FIG. 6 is a fragmentary cross sectional elevation view illustrative of a novel multilayer printed circuit board having an improved inter-layer structure provided between a power layer and a ground layer in a second embodiment in accordance with the first and second present inventions.

With reference to FIG. 6, the novel multilayer printed circuit board has the following lamination structure. The novel multilayer printed circuit board 1 has first and second dielectric layers 16a and 16b laminated to form an interlayer structure which is sandwiched between a power layer 4 and a ground layer 3. The ground layer 3 is also isolated by a first insulating layer 5a from a first signal layer 2a. The power layer 4 is also isolated by a second insulating layer 5b from a second signal layer 2b. The first and second dielectric layers 16a and 16b have large dielectric losses.

Namely, the inter-layer structure between the power layer 4 and the ground layer 3 comprises the first and second dielectric layers 16a and 16b which respectively comprise first and second dielectric substances which are different in frequency characteristic-of-complex dielectric constant $\epsilon^*$, wherein $\epsilon^*=\epsilon'-j\epsilon''$. The dielectric losses of the first and second dielectric substances are utilized to attenuate the electromagnetic wave in a wide frequency range. The attenuation characteristic of the electromagnetic wave generated from the power system depends upon a frequency characteristic of the dielectric losses of the first and second dielectric substances. The imaginary part $\epsilon''$ of the complex dielectric constant $\epsilon^*$ is utilized to attenuate the electromagnetic wave in a wide frequency range. A frequency characteristic of a high impedance device depends upon a frequency characteristic of a real part $\epsilon'$ of the complex dielectric constant $\epsilon^*$, wherein $\epsilon^*=\epsilon'-j\epsilon''$. Further, if a stationary wave is present in the power system of the device, this stationary wave is attenuated by the imaginary part $\epsilon''$ of the complex dielectric constant $\epsilon^*$, whereby the electromagnetic noise radiated from the power system may be suppressed. The attenuation characteristic of the electromagnetic wave generated from the power system has such a spectrum shape as averaging imaginary parts $\epsilon''$ of individuals of the first and second dielectric substances. The first and second dielectric substances which are different in frequency characteristic of complex dielectric constant $\epsilon^*$ suppress the radiation electromagnetic noises from the power system in the wide frequency range.

The above first and second dielectric layers 16a and 16b provide high impedance to the high frequency current flowing through the power layer 4, for which reason a majority part of the high frequency current from a first LSI not illustrated flows through a first de-coupling capacitor not illustrated and positioned near the first LSI, whilst a majority part of the other high frequency current from a second LSI not illustrated flows through a second de-coupling capacitor positioned near the second LSI. No large loop is thus formed, whereby the radiation electromagnetic noise is suppressed. The frequency characteristic of the high impedance device depends upon the frequency characteristic of the real part $\mu'$ of the complex dielectric constant $\epsilon^*$, wherein $\epsilon^*=\epsilon'-j\epsilon''$. If a stationary wave is present in the power system of the device in switching the LSIs, this stationary wave is attenuated by the imaginary part $\epsilon''$ of the complex dielectric constant $\epsilon^*$ of each of the first and second dielectric substances of the first and second dielectric layers 16a and 16b, whereby the electromagnetic noise radiated from the power system may be suppressed. The attenuation characteristic of the electromagnetic wave generated from the power system has such a spectrum shape as averaging imaginary parts $\epsilon''$ of individuals of the first and second dielectric substances.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed:

1. An inter-layer structure between a power layer and a ground layer, said inter-layer structure comprising a dielectric layered structure which comprises at least two dielectric substances which are different in frequency characteristic of complex dielectric constant.

2. The inter-layer structure as claimed in claim 1, wherein said dielectric layered structure comprises laminations of at least two layers being respectively made of dielectric substances which are different in frequency characteristic of complex dielectric constant.

3. The inter-layer structure as claimed in claim 2, wherein said at least two layers directly contact each other and directly contact a respective adjacent one of a ground layer and a power layer.

4. A multilayer printed circuit board having at least a signal layer, at least a power layer, at least a ground layer, and an inter-layer structure between said power layer and said ground layer, wherein said inter-layer structure comprises a dielectric layered structure which comprises at least two dielectric substances which are different in frequency characteristic of complex dielectric constant.

5. The multilayer printed circuit board as claimed in claim 1, wherein said dielectric layered structure comprises laminations of at least two layers being respectively made of dielectric substances which are different in frequency characteristic of complex constant.

6. The multilayer printed circuit board as claimed in claim 5, wherein said at least two layers directly contact each other and directly contact a respective adjacent one of the ground and power layers.

7. The multilayer printed circuit board as claimed in claim 4, wherein said at least power layer comprises a wiring layer which has at least an inductor part serving as an inductor and said at least power layer is connected to a de-coupling capacitor.

8. The multilayer printed circuit board as claimed in claim 7, wherein said at least an inductor part comprises a plurality of divided lines and first and second branched parts which are connected to each other through said divided lines.

* * * * *